United States Patent [19]
Ikeda

[11] Patent Number: 5,471,079
[45] Date of Patent: * Nov. 28, 1995

[54] SEMICONDUCTOR MEMORY DEVICE AND MANUFACTURING METHOD THEREOF

[75] Inventor: Yutaka Ikeda, Hyogo, Japan

[73] Assignee: Mitsubishi Denki Kabushiki Kaisha, Tokyo, Japan

[*] Notice: The portion of the term of this patent subsequent to Jan. 5, 2010, has been disclaimed.

[21] Appl. No.: 896,532

[22] Filed: Jun. 9, 1992

Related U.S. Application Data

[63] Continuation of Ser. No. 622,074, Dec. 4, 1990, Pat. No. 5,177,575.

[30] Foreign Application Priority Data

Dec. 18, 1989 [JP] Japan .................... 1-329321

[51] Int. Cl.[6] .................... H01L 29/68; H01L 29/40; H01L 23/48
[52] U.S. Cl. .................... 257/296; 257/306; 257/401; 257/503
[58] Field of Search .................... 357/23.6, 51, 53, 357/67, 68, 71; 257/296, 306, 401, 503

[56] References Cited

U.S. PATENT DOCUMENTS 5,177,575  1/1993  Ikeda .................... 257/503

OTHER PUBLICATIONS

"A New Stacked Capacitor DRAM Cell Characterized by a Storage Capacitor on a Bit-Line Structure" by Shin'ichiro Kimura et al, IEDM 88 (1988), pp. 596–599.
"3-Dimensional Stacked Capacitor Cell for 16M and 64M DRAMS" by T. Ema et al., IEDM 88 (1988), pp. 592–595.

Primary Examiner—Mark V. Prenty
Attorney, Agent, or Firm—Lowe, Price, LeBlanc & Becker

[57] ABSTRACT

Disclosed is a semiconductor memory device having such a structure that a voltage variation on a bit line does not affect a voltage on another bit line. A gate electrode portion branches and extends laterally from a word line and extends almost in parallel with the bit line. First and second impurity regions of a field effect transistor are formed in regions between adjacent word lines, with the gate electrode portion therebetween. A capacitor electrically connected to the second impurity region is formed to cover the bit lines. Since the capacitor is between adjacent bit lines, no voltage variation on one bit line affects a voltage on the other bit lines.

14 Claims, 15 Drawing Sheets

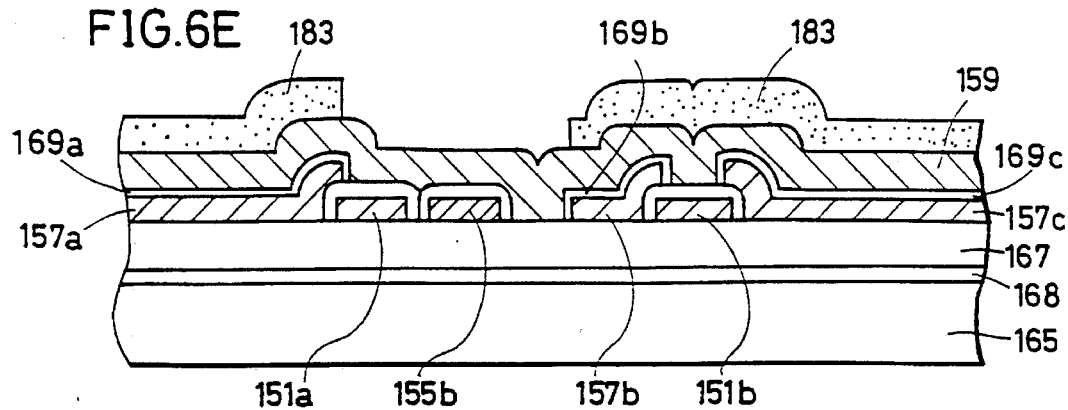
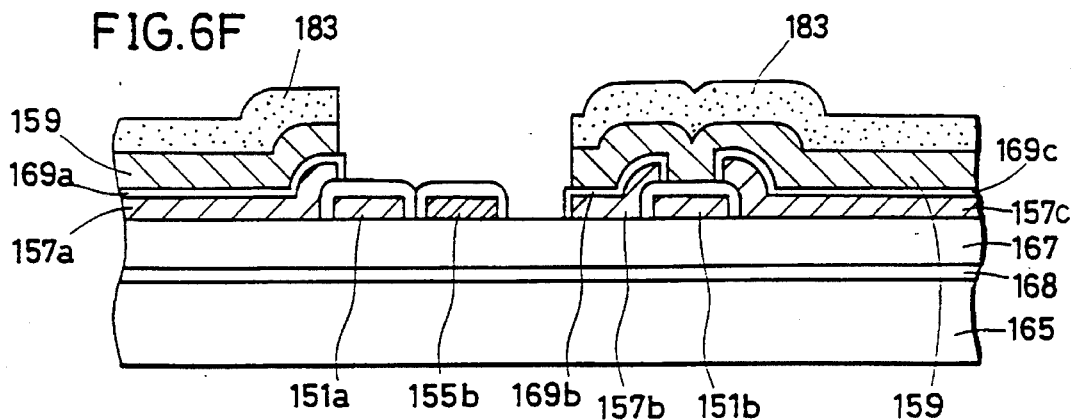
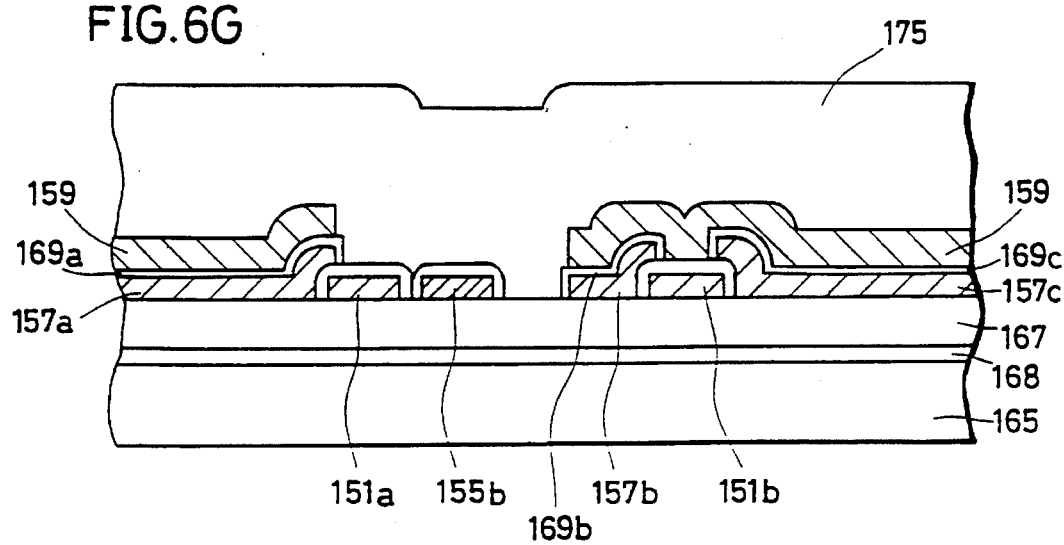

SEMICONDUCTOR MEMORY DEVICE AND MANUFACTURING METHOD THEREOF

This application is a continuation of application Ser. No. 07/622,074 filed Dec. 4, 1990 and now U.S. Pat. No. 5,177,575.

BACKGROUND OF THE INVENTION

Field of the Invention

The present invention relates generally to semiconductor memory devices, and more particularly to a dynamic random access memory (hereinafter referred to as DRAM).

Description of the Background Art

Semiconductor memory devices are employed in main memory devices of computers. A DRAM is one type of the semiconductor memory devices. FIG. 7 is a block diagram showing one example of an overall structure of a conventional DRAM. The structure of the DRAM will now be described with reference to FIG. 7. As shown in the figure, the DRAM includes a memory cell array 1, a row decoder 3, a column decoder 5, a row address buffer 7, a column address buffer 9 and a sense amplifier 11.

The memory cell array 1 is formed of a large number of memory cells which are unit storage circuits. The row address buffer 7 and column address buffer 9 store a row address signal and a column address signal, respectively. Information of the memory cells for reading/writing are transmitted in the form of the row address signal and column address signal. The row decoder 3 is provided between the memory cell array 1 and the row address buffer 7. The row decoder 3 decodes the row address signal. Decoding the row address signal selects a specific word line 15.

The column decoder 5 is provided between the memory cell array 1 and the column address buffer 9. The column decoder 5 decodes the column address signal. Decoding the column address signal selects a specific bit line 17. Selecting the bit line and word line selects a specific memory cell.

The sense amplifier 11 is provided between the memory cell array 1 and the column decoder 5. The sense amplifier 11 amplifies a signal stored in the selected memory cell to read the amplified signal.

An operation of the DRAM will be briefly described with reference to FIG. 7. First, with a row address inputted, a specific word line is selected. This selection of the word line causes all memory cells connected to the selected word line to be coupled to the sense amplifier 11.

Next, with a column address inputted, a specific bit line is selected. This selection of the bit line causes one sense amplifier in the sense amplifier 11 to be coupled to an input/output (I/O) circuit. Reading or writing is carried out in accordance with an instruction of a control circuit.

FIG. 9 is a plan view of a memory cell portion. As shown in the figure, a word line 19a and another word line 19b are provided in parallel. A bit line 21a and another bit line 21b are provided in parallel. The word lines 19a and 19b and the bit lines 21a and 21b are crossing over each other. The bit line 21a comprises an extended portion 22a and a contact portion 22b. An active region 26 is provided beneath the bit line 21a. The active region 26 extends in the same direction as the bit line 21a. The word line 19a intersects the active region 26. The word line 19b intersects the active region 26. The active region 26 has one end electrically connected to a storage node 23a and the other end electrically connected to a storage node 23b. A storage node 23c is provided above an intersection between the word line 19a and bit line 21b. A storage node 23d is provided above an intersection between the word line 19b and bit line 21b.

A cell plate 25 is provided in regions other than the region between the storage nodes 23a and 23b. The cell plate 25 is provided above the storage nodes 23a, 23b, 23c and 23d. A contact hole 27 is provided in a region between the word lines 19a and 19b above the active region 26.

There is a case where the word lines 19a and 19b make contact with an upper layer interconnection. When the word lines 19a and 19b make contact with a portion located on the active region 26, the following problem occurs. When an interconnection connecting the word lines 19a and 19b and the upper layer interconnection is connected with the active region 26 as well as the word lines 19a and 19b, shorts occurs. Thus, as shown in FIG. 9, the position where the word lines 19a and 19b are in contact with the upper layer interconnection is portions other than on the active region 26.

FIG. 10 is a cross sectional view of the memory cell of FIG. 9 taken along the direction of the arrow X. Referring to the figure, field oxide films 33a and 33b are formed at opposite ends of a main surface of a silicon substrate 29. The field oxide films 33a and 33b become insulator films for isolation. $n^+$ impurity regions 31a, 31b, 31c are formed spaced apart from one another in the main surface of the silicon substrate 29 between the field oxide films 33a and 33b. The region between the $n^+$ impurity regions 31a and 31b is a channel region 20a, while the region between the $n^+$ impurity regions 31b and 31c is a channel region 20b.

A gate oxide film 35a is formed on the main surface of the silicon substrate 29 between the $n^+$ impurity regions 31a and 31b. On the gate oxide film 35a is formed the word line 19a to be a gate electrode. A gate oxide film 35b is formed on the main surface of the silicon substrate 29 between the $n^+$ impurity regions 31b and 31c. On the gate oxide film 35b is formed the word line 19b to be a gate electrode.

An interlayer insulation film 37 is formed on the field oxide films 33a and 33b, on the $n^+$ impurity regions 31a, 31b and 31c and on the word lines 19a and 19b. A contact hole 36a is formed in the interlayer insulation film 37 on the $n^+$ impurity region 31a. The storage node 23a made of polysilicon is formed over the interlayer insulation film 37 on the $n^+$ impurity region 31a. The storage node 23a and the $n^+$ impurity region 31a are electrically connected by the polysilicon filled in the contact hole 36a. A thin silicon oxide film 39a is formed over the surface of the storage node 23a. The silicon oxide film 39a is to be a dielectric. On the silicon oxide film 39a is formed the cell plate 25 made of polysilicon. The storage node 23a, the thin silicon oxide film 39a and the cell plate 25 constitute a capacitor 40a.

A contact hole 36b is formed in the interlayer insulation film 37 on the $n^+$ impurity region 31c. The storage node 23b made of polysilicon is formed over the interlayer insulation film 37 on the $n^+$ impurity region 31c. The storage node 23b and $n^+$ impurity region 31c are electrically connected by the polysilicon filled in the contact hole 36b. A thin silicon oxide film 39b is formed over the storage node 23b. The silicon oxide film 39b is to be a dielectric. On the silicon oxide film 39b is formed the cell plate 25 made of polysilicon. The storage node 23b, the thin silicon oxide film 39b and the cell plate 25 constitute a capacitor 40b.

An interlayer insulation film 41 is formed on the cell plate 25 and on the interlayer insulation film 37. The contact hole 27 is formed in the interlayer insulation films 37 and 41 on the $n^+$ impurity region 31b. On the interlayer insulation film 41 is formed the bit line 21a made of aluminum. The bit line 21a comprises the extended portion 22a and the contact portion 22b. The contact portion 22b of the bit line 21a is electrically connected with the $n^+$ impurity region 31b. On the bit line 21a is formed an insulator film 42.

FIG. 11 is a cross sectional view of the memory cell of FIG. 9 taken along the direction of the arrow XI. Referring to FIG. 11, field oxide films 33c and 33d and the gate oxide film 35b are formed in the main surface of the silicon substrate 29. The gate oxide film 35b is between the field oxide films 33c and 33d. The word line 19b is formed on the field oxide films 33c and 33d and on the gate oxide film 35b. On the word line 19b is formed the interlayer insulation film 37. The storage node 23d is formed on the interlayer insulation film 37. A thin silicon oxide film 39d is formed on the storage node 23d and at the side of the storage node 23d. The silicon oxide film 39d is to be a dielectric. The cell plate 25 is formed on the silicon oxide film 39d and on the interlayer insulation film 37.

The interlayer insulation film 41 is formed on the cell plate 25. The bit lines 21a and 21b are formed spaced apart from each other on the interlayer insulation film 41. The insulator film 42 is formed over the interlayer insulation film 41 and on the bit lines 21a and 21b.

The DRAM allows a state that electrons are stored in the capacitor to be correspondent with "0" of a digital binary signal and allows a state that no electrons are stored in the capacitor to be correspondent with "1" of the digital binary signal.

A method of writing data into the capacitor will now be described with reference to FIG. 10. In writing "0", a positive voltage is first applied to the word line 19a so as to form a channel in the silicon substrate 29 between the $n^+$ impurity regions 31a and 31b. Then, a 0 V voltage is applied to the bit line 21a to put the $n^+$ impurity region 31b in a 0 V state. The electrons are thereby supplied from the bit line 21a to the capacitor 40a. The voltage applied to the word line 19a is then released. The writing of "0" into the capacitor 40a is thus completed.

In writing "1" into the capacitor 40a, a positive voltage is first applied to the word line 19a so as to form a channel in the silicon substrate 29 between the $n^+$ impurity regions 31a and 31b. A 5 V voltage is then applied to the bit line 21a to put the $n^+$ impurity region 31b in a 5 V state. The electrons are thereby drawn from the capacitor 40a to the bit line 21a. The voltage applied to the word line 19a is then released. The writing of "1" into the capacitor 40a is thus completed.

A method of reading data will now be described with reference to FIG. 10. A voltage is applied to the bit line 21a to make the bit line 21a have a predetermined potential Vp. This is called a precharge of the bit line 21a. After precharged, the bit line 21a is electrically separated from a power supply to be brought into a floating state.

Next, a positive voltage is applied to the word line 19a so as to form a channel in the silicon substrate 29 between the $n^+$ impurity regions 31a and 31b. The electrons stored in the capacitor 40a and those existing in the $n^+$ impurity region 31b are thereby averaged. Consequently, when data of "0" is written in the capacitor 40a, the electrons stored in the capacitor 40a are expelled to the $n^+$ impurity region 31b, so that a potential on the bit line 21a is slightly lowered from Vp down to Vp'.

When data of "1" is written in the capacitor 40a, there are few electrons in the capacitor 40a, so that the potential Vp on the bit line 21a hardly varies. These voltage variations are amplified by the sense amplifier 11 shown in FIG. 7, so that the data of "0" or "1" is read out.

A floating capacitance of the bit line is approximately 10–20 times larger than a capacitance of the capacitor. Therefore, there is only a slight difference in signal voltage appearing on the bit line between upon reading "1" and "0". Thus, the conventional DRAM shown in FIGS. 9, 10 and 11 has such a problem as will be described below.

As shown in FIG. 11, only insulator films 41 and 42 are between the bit lines 21a and 21b. It is assumed that a voltage on the bit line 21b varies, for example, from 0 V to 5 V while the bit line 21a is reading data. It sometimes happens that because of the voltage variation on the bit line 21b, an electric field in a region between the bit lines 21a and 21b changes, and hence the voltage on the bit line 21a slightly varies. The variation in voltage on the bit line 21b causes the bit line 21a to transmit erroneous data (for example, not "0" but "1" or visa versa) to the sense amplifier. The erroneous data causes erroneous operation of the memory device.

A description will now be given on the fact that a voltage on a bit line influences voltages on adjacent bit lines, with reference to an equivalent circuit diagram and a waveform diagram of a memory cell. FIG. 8A is an equivalent circuit diagram of a memory cell. A memory cell 13 includes a set of a field effect transistor Q and a capacitor Cs. Bit lines B0 and $\overline{B0}$ constitute one bit line. Bit lines B1 and $\overline{B1}$ constitute one bit line. A word line is denoted with a symbol WL, and a sense amplifier is denoted with a symbol SA.

FIG. 8B is a waveform diagram of voltages on the bit lines B0, $\overline{B0}$, B1 and $\overline{B1}$. The voltage on the bit line B1, which should be shown by dotted lines, is actually shown by solid lines. This is because the voltage on the bit line $\overline{B0}$ influences the voltage on the bit line B1. Since the voltage on the bit line B1 is shown by the solid lines, the voltage on the bit line $\overline{B1}$ is also shown by solid lines. Accordingly, the bit line constituted by the bit lines B1 and $\overline{B1}$ transmits erroneous data to the sense amplifier. A DRAM which serves to solve this problem is described below.

This DRAM is disclosed in IEDM (International Electron Devices Meeting) 88, pp. 596–599. FIG. 12 is a plan view of a memory cell of this DRAM. This memory cell is hereinafter called a buried-bit line type memory cell. Referring to FIG. 12, word lines 45a, 45b and 45c extend in parallel spacing apart from one another. Bit lines 47a and 47b extend perpendicularly to the direction of the extending word lines 45a, 45b and 45c. The bit lines 47a and 47b extend in parallel spaced apart from each other. An active region 43a extends obliquely from the word line 45a to the word line 45b. The active region 43a intersects the bit line 47a. A storage node 49a is electrically connected to one end of the active region 43a, which is on the word line 45a side. A storage node 49b is electrically connected to the other end of the active region 43a. An active region 43b extends obliquely from the word line 45c to an adjacent word line (not shown in FIG. 12). A storage node 49c is electrically connected to one end of the active region 43b, which is on the word line 45c side.

FIG. 13 is a cross sectional view of the buried-bit line type memory cell of FIG. 12 taken along the direction of the arrow XIII. As shown in FIG. 13, impurity regions 53a, 53b and 53c are formed spaced from one another near a main surface of a silicon substrate 51. A gate oxide film 55a is formed on the main surface of the silicon substrate 51 between the impurity regions 53a and 53b. The word line 45a is formed on the gate oxide film 55a. An insulator film 57a is formed on and at opposite sides of the word line 45a.

A gate oxide film 55b is formed on the main surface of the silicon substrate 51 between the impurity regions 53b and 53c. The word line 45b is formed on the gate oxide film 55b. An insulator film 57b is formed on and at opposite sides of the word line 45b. A portion of the silicon substrate 51 between the impurity regions 53a and 53b is to be a channel forming region 56a. A portion of the silicon substrate 51 between the impurity regions 53b and 53c is to be a channel forming region 56b. All of the impurity regions 53a, 53b and 53c and the channel forming regions 56a and 56b connected together form the active region 43a shown in FIG. 12.

The bit line 47a is formed between the word lines 45a and 45b. The bit line 47a is electrically connected to the impurity region 53b. An insulator film 59 is formed on and at opposite sides of the bit line 47a.

The storage node 49a is electrically connected to the impurity region 53a. The storage node 49a is in contact with the insulator films 57a and 59. On the storage node 49a is formed a thin silicon oxide film 61a to be a dielectric. The storage node 49b is electrically connected to the impurity region 53c. The storage node 49b is in contact with the insulator films 57b and 59. On the storage node 49b is formed a thin silicon oxide film 61b to be a dielectric. A cell plate 63 is formed on the silicon oxide films 61a and 61b. On the cell plate 63 is formed an insulator film 62. FIG. 14 is an exploded view of the memory cell shown in FIG. 12.

As shown in FIG. 13, the bit line 47a of the buried-bit line type memory cell is electrostatically shielded by the storage nodes 49a and 49b and by the cell plate 63. Therefore, no voltage variation on the bit line 47a shown in FIG. 12 causes a voltage variation on the bit line 47b. That is, when a voltage on the bit line 47a shown in FIG. 13 varies, charges are absorbed in a capacitor formed of the bit line 47a and the storage nodes 49a and 49b and in a capacitor formed of the bit line 47a and the cell plate 63.

However, in the buried-bit line type memory cell shown in FIG. 13, the bit line 47a, the storage nodes 49a and 49b and the cell plate 63 are formed after the formation of the word lines 45a and 45b. Thus, it is understood that the word lines 45a and 45b are not made of aluminum but polysilicon. This is possible because the melting point of polysilicon (1414° C.) is higher than that of aluminum (660° C.). That is, if the word lines 45a and 45b are of polysilicon, the word lines 45a and 45b do not melt in the formation of the bit line 47a or the like.

However, the sheet resistance value of polysilicon is 10–30 $\Omega/\square$, while that of aluminum is 30 m$\Omega/\square$. Therefore, power consumption of this buried-bit line type memory cell which has the word lines 45a and 45b made of polysilicon is increased.

SUMMARY OF THE INVENTION

An object of the present invention is to provide a semiconductor memory device including a memory cell having a structure that a voltage variation on a bit line does not affect a voltage on another bit line and that is different from the structure of the above described buried-bit line type memory cell.

Another object of the present invention is to provide a semiconductor memory device having a structure that a voltage variation on a bit line does not affect a voltage on another bit line and that is different from the structure of the above described buried-bit line type memory cell and also can achieve low resistance of a word line.

A further object of the present invention is to provide a semiconductor memory device having a structure that a voltage variation on a bit line does not affect a voltage on another bit line and that is different from the structure of the above described buried-bit line type memory cell and also can achieve enlargement of a contact allowable region of a word line.

A still further object of the present invention is to provide a method of manufacturing a semiconductor memory device having a structure that a voltage variation on a bit line does not affect a voltage on another bit line and that is different from the structure of the above described buried-bit line type memory cell and also can achieve low resistance of a word line.

The semiconductor memory device according to the present invention includes a semiconductor substrate having a main surface, a word line, a field effect transistor, a bit line and a capacitor.

According to a first aspect of the present invention, the semiconductor memory device has the following structure. The word line is formed on the main surface of the semiconductor substrate. The field effect transistor includes a first impurity region, a second impurity region and a gate electrode portion. The first impurity region is formed in the main surface of the substrate. The second impurity region is formed in the main surface of the substrate, spaced apart from the first impurity region to form a channel region. The gate electrode portion is formed on the main surface and extending laterally from the word line to the channel region. The bit line is formed on the main surface of the semiconductor substrate to be electrically connected to the first impurity region and crossing the word line at a different level above the substrate. The capacitor includes a first electrode layer electrically connected to the second impurity region, and a second electrode layer facing the first electrode layer, with a dielectric therebetween. According to the first aspect of the present invention, the semiconductor memory device is structured such that at least one of the first and second electrode layers is formed at an equal level to or at a higher level than the level of the bit line formed on the main surface.

A second aspect of the present invention is a method of manufacturing the semiconductor memory device in accordance with the first aspect of the present invention. According to the second aspect, the method of manufacturing the semiconductor memory device includes the following steps. On the main surface of the semiconductor substrate are simultaneously formed the word line and the gate electrode portion of the field effect transistor, branching and extending laterally from the word line. Then, the first and second impurity regions of the field effect transistor are formed in portions in the main surface of the semiconductor substrate, with the gate electrode portion therebetween. The bit line, electrically connected to the first impurity region and crossing the word line, is then formed on the main surface of the semiconductor substrate. Next, the capacitor is formed to be electrically connected to the second impurity region and electrostatically shield the bit line.

According to a third aspect of the present invention, a semiconductor memory device distinguishes over the semiconductor memory device of the first aspect in that a material of a gate electrode portion is different from that of a word line.

A fourth aspect of the present invention is a method of manufacturing the semiconductor memory device according to the third aspect of the present invention. According to the fourth aspect, the method of manufacturing the semiconductor memory device includes the following steps. A first insulator film is formed on the main surface of the semiconductor substrate. On the first insulator film is then formed the gate electrode portion, bit line and first electrode layer spaced apart from one another. Next, a dielectric is formed on the first electrode layer. The second electrode layer is then formed on the dielectric. A second insulator film is formed on the gate electrode portion, on the bit line and on the second electrode layer. Then, the second insulator layer on the gate electrode portion is selectively etched away so as to form a contact hole. Next, the word line is formed on the second insulator film so that the direction of the extending word line crosses that of the extending gate electrode portion, thereby allowing the word line and gate electrode portion to be electrically connected by a conductive member provided in the contact hole.

Actions and effects of the first aspect of the present invention will now be described. The bit line is electrically connected to the first impurity region. The second impurity region electrically connected to the first electrode layer is provided so as not to be placed under the bit line. The gate electrode portion branches and extends laterally from the word line. The gate electrode portion is provided on the main surface of the substrate between the first and second impurity regions.

No bit line exists on the second impurity region, as described above. Therefore, it is possible to form one of the first and second electrode layers at an equal level to or at a higher level than the level of the bit line on the main surface of the substrate. Thus, when a voltage on the bit line varies, charges are absorbed in a capacitor formed of the bit line and the electrode layer provided at an equal level or at a higher level than the level of the bit line. Accordingly, voltage variation on the bit line does not affect a voltage on the adjacent bit line. Therefore, the voltage variation on the bit line does not cause the adjacent bit line to transmit an erroneous signal to a sense amplifier, resulting in no malfunctions of a computer.

Actions and effects of the third aspect of the present invention will now be described. The material of the word line differs from that of the gate electrode portion. This makes it possible to form the word line and gate electrode portion with most preferable materials.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6I are cross sectional views showing in turn the steps of manufacturing the portion shown in FIG. 5;

DESCRIPTION OF THE PREFERRED EMBODIMENTS

Figure 1:
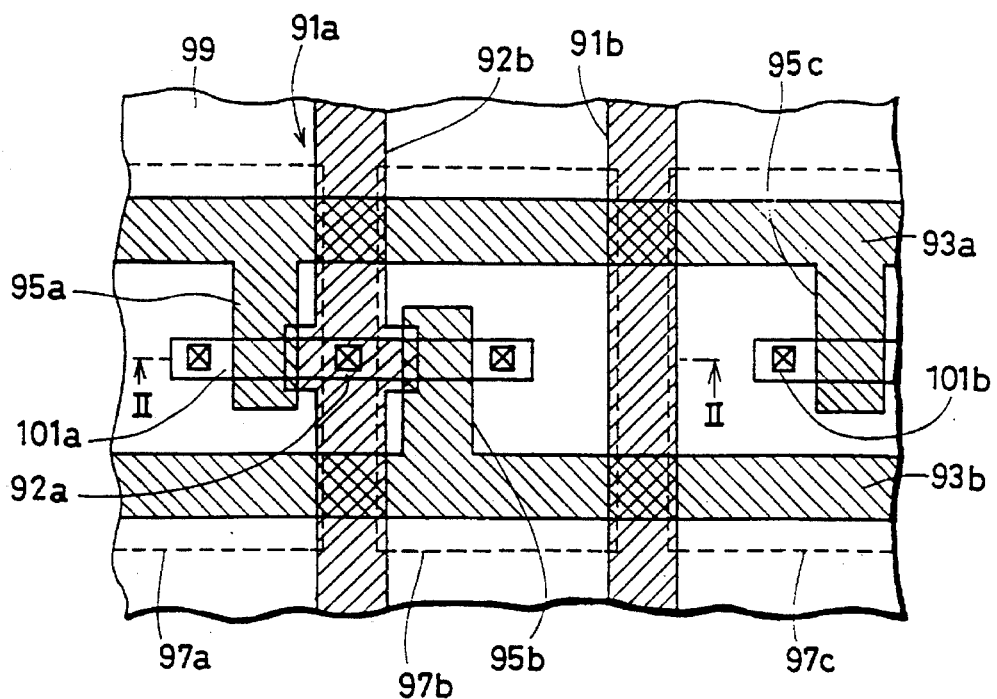
FIG. 1 is a plan view showing a memory cell portion according to one embodiment of a semiconductor memory device of the present invention.

One embodiment of a DRAM according to the present invention will now be described. As shown in FIG. 1, bit lines 91a and 91b extend in parallel spaced from each other. The bit lines 91a and 91b are made of polysilicon. The bit line 91a comprises a contact portion 92a and an extended portion 92b. The bit line 91b also comprises a contact portion and an extended portion; however, only the extended portion thereof is represented in FIG. 1. Word lines 93a and 93b extend spaced from each other in a direction perpendicular to the direction of the extending bit lines 91a and 91b. Active regions 101a and 101b are provided in a region between the word lines 93a and 93b. The active regions 101a and 101b extend in the same direction as that of the word lines 93a and 93b. The active region 101a extends perpendicularly to the direction of the extending bit line 91a. The active region 101a is electrically connected to the contact portion 92a of the bit line 91a.

A gate electrode portion 95a branching and extending laterally from the word line 93a is provided on portions of the active region 101a between one end of the active region 101a and the bit line 91a. A gate electrode portion 95b branching and extending laterally from the word line 93b is provided on portions of the active region 101a between the other end thereof and the bit line 91a. A gate electrode portion 95c branching and extending laterally from the word line 93a is provided on the active region 101b.

On the bit lines 91a and 91b and on the word lines 93a and 93b are provided storage nodes 97a, 97b and 97c. These storage nodes 97a–97c are made of polysilicon. One end of the active region 101a is electrically connected to the storage node 97a. The other end of the active region 101a is electrically connected to the storage node 97b. One end of the active region 101b is electrically connected to the storage node 97c. A cell plate 99 made of polysilicon is formed on the storage nodes 97a–97c.

Figure 2A:
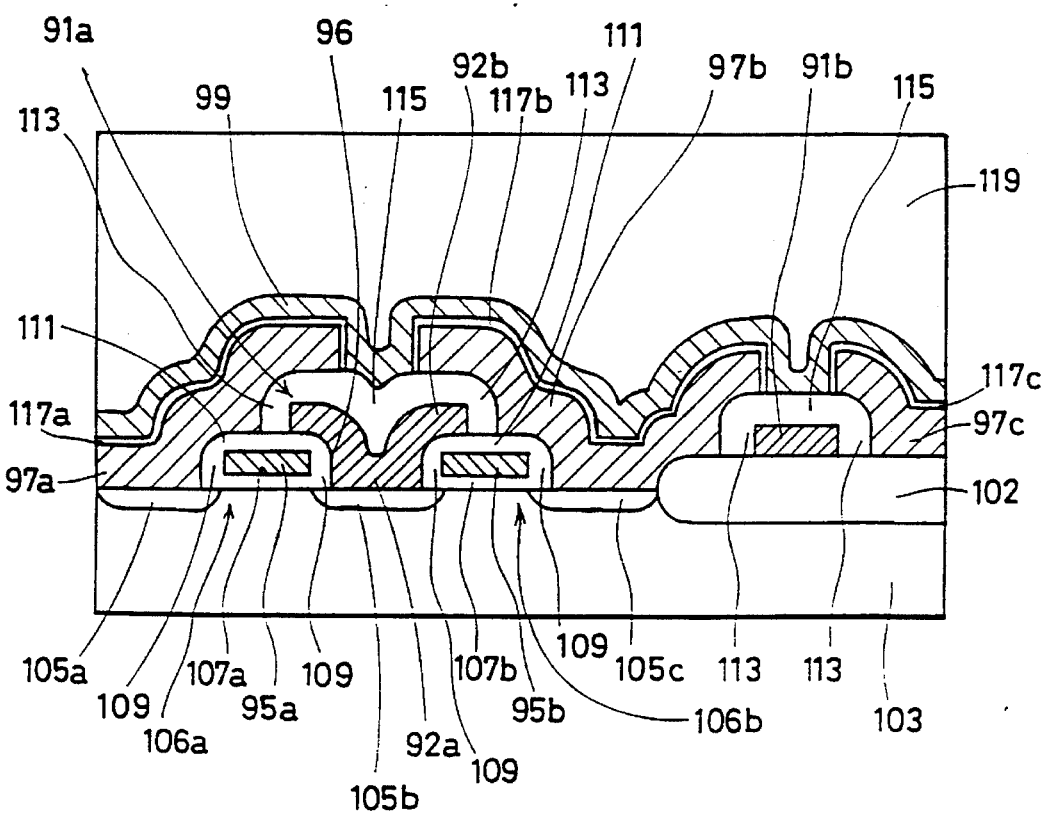
FIG. 2A is a cross sectional view of the memory cell shown in FIG. 1 taken along the direction of the arrow II.

FIG. 2A is a cross sectional view of the memory cell shown in FIG. 1 taken along the direction of the arrow II. Referring to FIG. 2A, impurity regions 105a, 105b and 105c are formed near a main surface of a silicon substrate 103. The impurity regions 105a–105c are formed spaced apart from one another. A field oxide film 102 is formed on the silicon substrate 103. The impurity regions 105b and 105c are formed between the field oxide film 102 and the impurity region 105a.

A portion of the silicon substrate 103 between the impurity regions 105a and 105b is to be a channel forming region 106a. A portion of the silicon substrate 103 between the impurity regions 105b and 105c is to be a channel forming region 106b. The impurity regions 105a–105c and the channel forming regions 106a and 106b connected together constitute the active region 101a shown in FIG. 1.

A gate oxide film 107a is formed on the silicon substrate 103 between the impurity regions 105a and 105b. The gate electrode portion 95a is formed on the gate oxide film 107a. The gate electrode portion 95a serves as a gate electrode. On the gate electrode portion 95a is formed a silicon oxide film 111. A sidewall insulator film 109 is formed at the opposite sides of the gate electrode portion 95a. A gate oxide film 107b is formed on the silicon substrate 103 between the impurity regions 105b and 105c. On the gate oxide film 107b is formed the gate electrode portion 95b. The gate electrode portion 95b serves as a gate electrode. On the gate electrode portion 95b is formed the silicon oxide film 111. The sidewall insulator film 109 is formed at the opposite sides of the gate electrode portion 95b.

A contact hole 96 is formed on the silicon substrate 103 between the gate electrode portions 95a and 95b. The contact portion 92a of the bit line 91a is filled in the contact hole 96. The extended portion 92b of the bit line 91a is provided on the contact hole 96. The contact portion 92a of the bit line 91a is electrically connected to the impurity region 105b. On the bit line 91a is formed a silicon oxide film 115. A sidewall insulator film 113 is formed on the opposite sides of the bit line 91a. The bit line 91b is formed on the field oxide film 102. The silicon oxide film 115 is formed on the bit line 91b. The sidewall insulator film 113 is formed on the opposite sides of the bit line 91b.

Figure 2B:
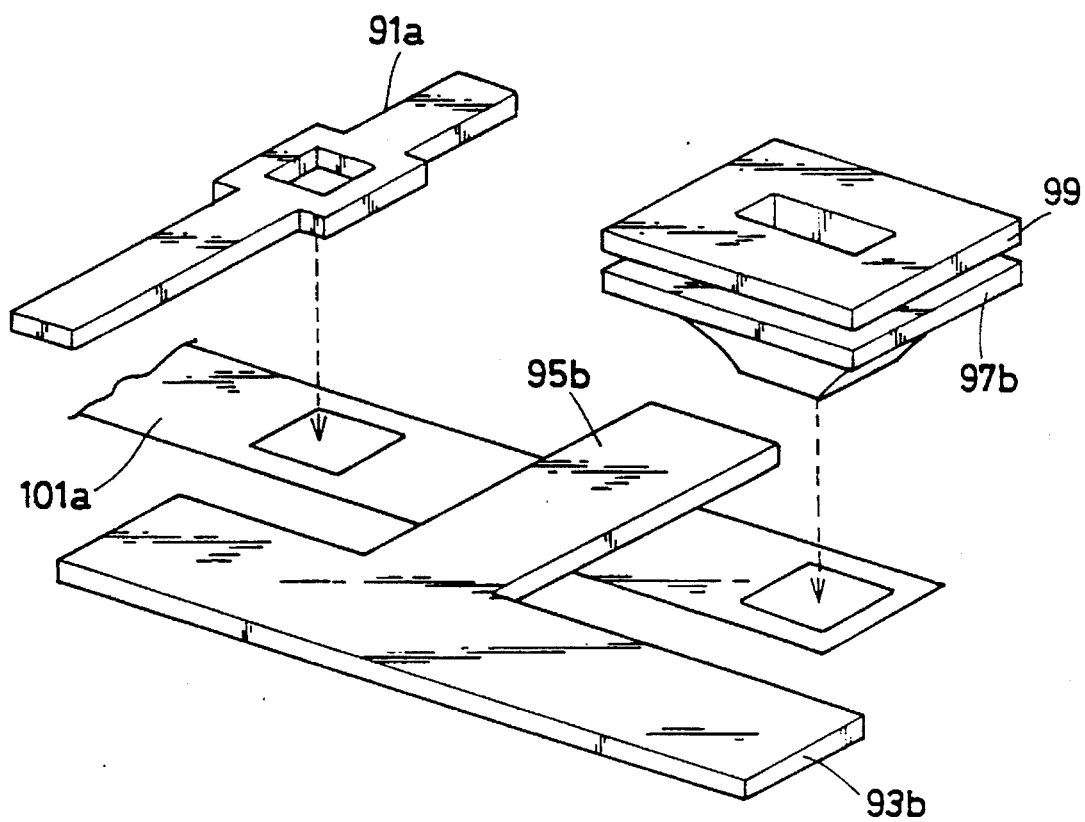
FIG. 2B is an exploded view of the memory cell shown in FIG. 1.

The storage node 97a is formed on the impurity region 105a. The storage node 97a and the impurity region 105a are electrically connected. On the storage node 97a is formed a thin silicon oxide film 117a to be a dielectric. The storage node 97b is formed on the impurity region 105c. The storage node 97b is electrically connected to the impurity region 105c. On the storage node 97b is formed a thin silicon oxide film 117b to be a dielectric. The storage node 97c is formed on the field oxide film 102. On the storage node 97c is formed a thin silicon oxide film 117c to be a dielectric. The cell plate 99 is formed on the silicon oxide films 117a–117c. On the cell plate 99 is formed a BPSG film 119. FIG. 2B is an exploded view of the memory cell shown in FIG. 1.

Figure 3A:
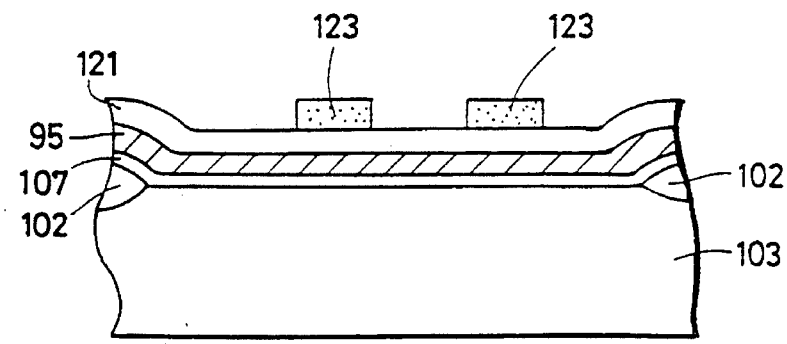
FIGS. 3A–3N are cross sectional views showing in turn the steps of manufacturing the memory cell of the embodiment of the semiconductor memory device according to the present invention.

A description will be given on a method of manufacturing the memory cell of the embodiment of the DRAM in accordance with the present invention. FIGS. 3A–3N are partial cross sectional views showing in processing steps a method of manufacturing the portion shown in FIGS. 2A, in which views the bit line 91b is not represented.

Referring to FIG. 3A, a field oxide film 102 is formed on a silicon substrate 103. The field oxide film 102 is formed to enclose an element forming region on the silicon substrate 103. A thin silicon oxide film 107 is then formed on the silicon substrate 103 and on the field oxide film 102. A polysilicon film 95 is formed on the silicon oxide film 107 by employing a CVD (Chemical Vapor Deposition) method. A silicon oxide film 121 is then formed on the polysilicon film 95 by the CVD method. On the silicon oxide film 121 is then formed a resist 123 which is then subjected to a predetermined patterning.

Figure 3B:
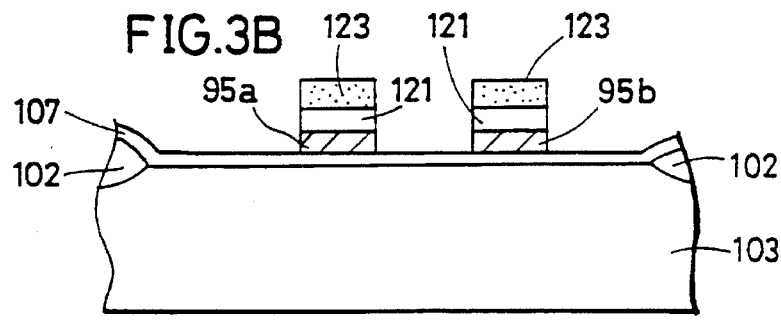

Referring to FIG. 3B, the silicon oxide film 121 and polysilicon film 95 are selectively removed, with the resist 123 used as mask. The silicon oxide film 121 and polysilicon film 95 are removed by reactive ion etching which is a type of anisotropical etching. The polysilicon film left on the silicon substrate 103 is to be gate electrode portions 95a and 95b, serving as gate electrodes.

Figure 3C:
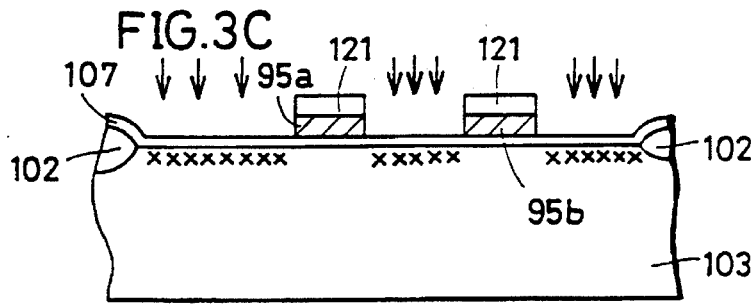

The resist 123 is removed, as shown in FIG. 3C. Phosphorus is implanted into the silicon substrate 103, with the silicon oxide film 121 and field oxide film 102 used as mask.

Figure 3D:
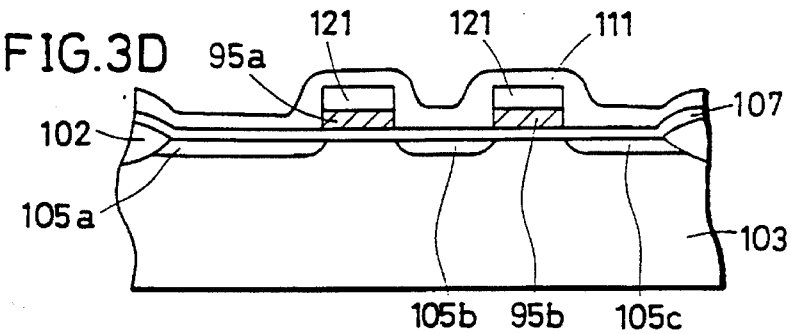

Ions implanted are then subjected to annealing, as shown in FIG. 3D. This annealing causes a thermal diffusion of the phosphorus implanted into the silicon substrate 103 so as to form impurity regions 105a, 105b and 105c. Since the implanted ions are phosphorus, the impurity regions 105a–105c are of N type. A silicon oxide film 111 is formed over the whole surface of the silicon substrate 103 by the CVD method.

Figure 3E:
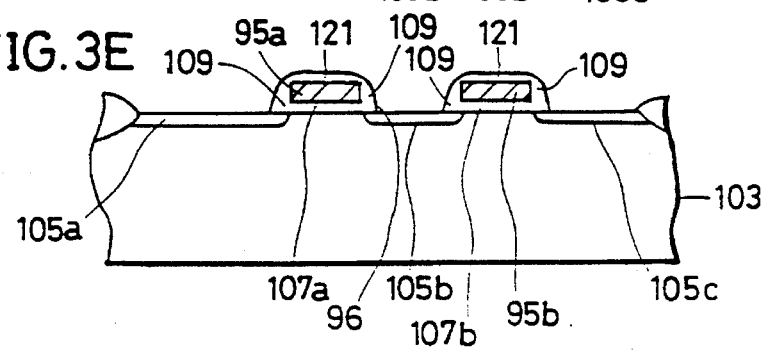

Referring to FIG. 3E, a sidewall insulator film 109 is formed on the side portions of the gate electrode portions 95a and 95b by employing the reactive ion etching being anisotropical etching. The sidewall insulator film 109 which is between the gate electrode portions 95a and 95b forms a contact hole 96.

Figure 3F:
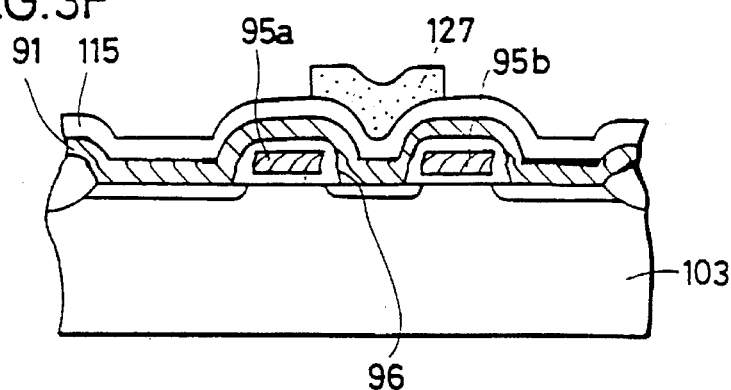

With reference to FIG. 3F, a polysilicon film 91 is formed over the whole surface of the silicon substrate 103 by the CVD method. A silicon oxide film 115 is then formed on the polysilicon film 91 by the CVD method. On the silicon oxide film 115 is then formed a resist 127 which is then subjected to a predetermined patterning.

Figure 3G:
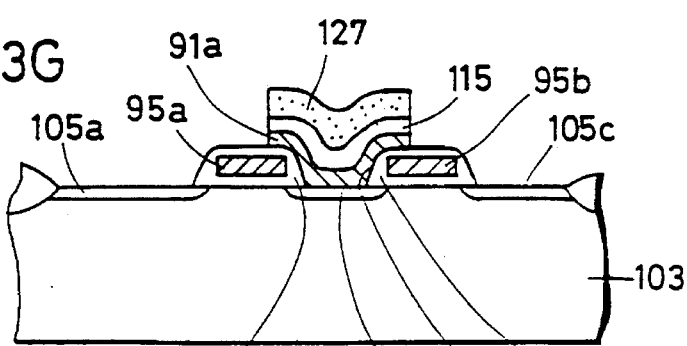
Figure 10:
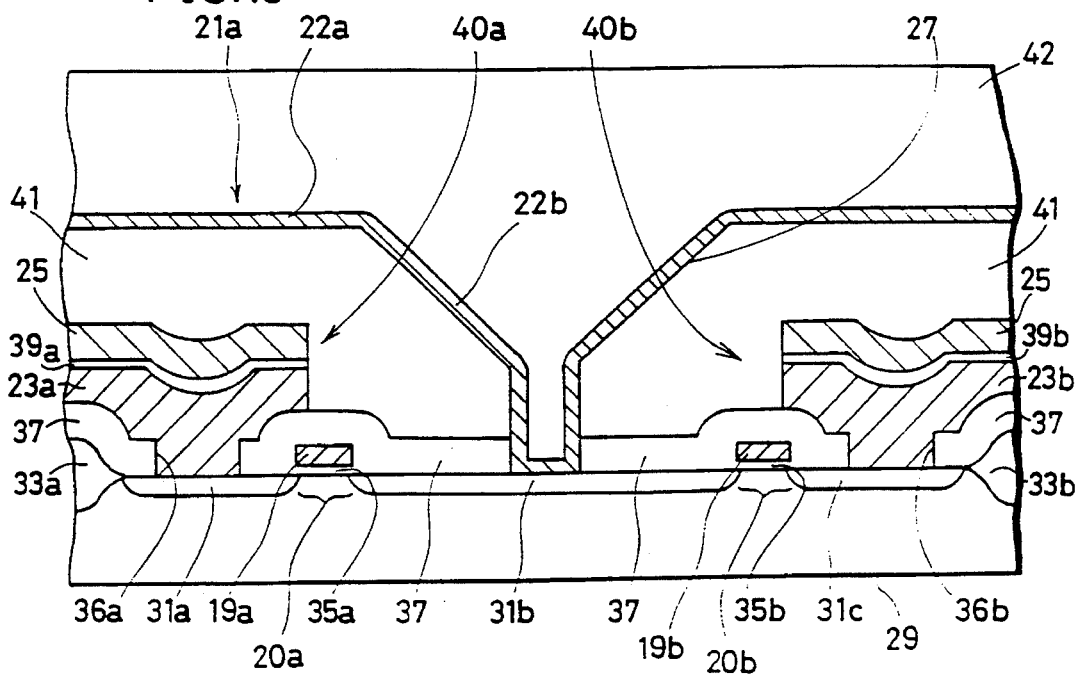
FIG. 10 is a cross sectional view of the memory cell shown in FIG. 9 taken along the direction of the arrow X.
Figure 11:
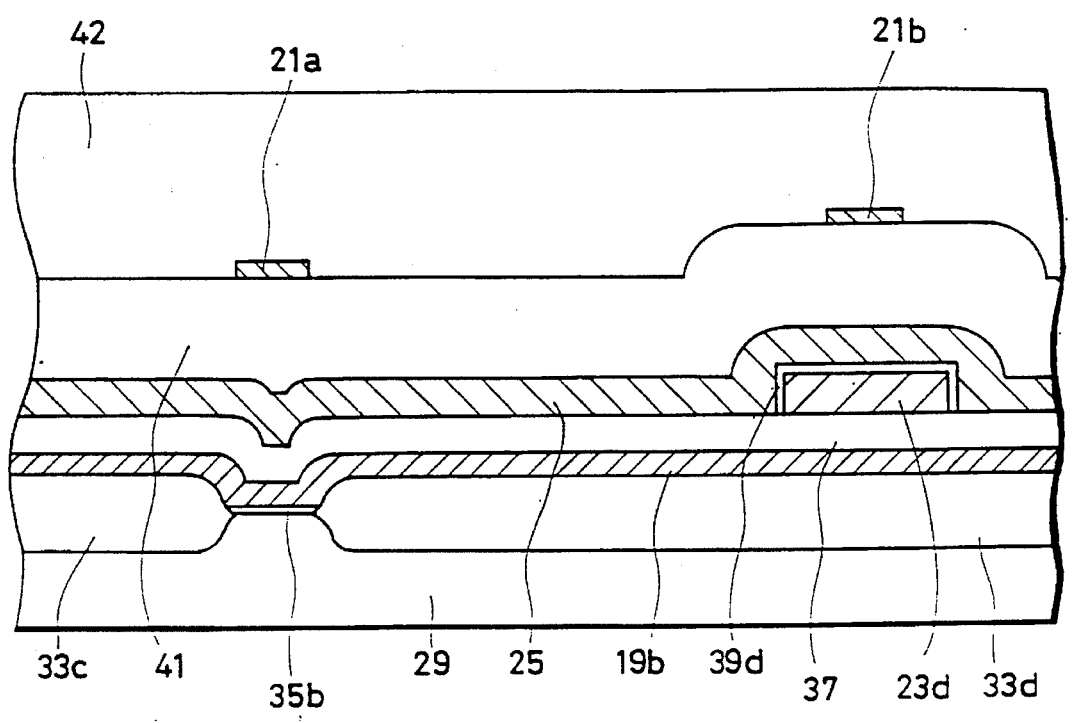
FIG. 11 is a cross sectional view of the memory cell shown in FIG. 9 taken along the direction of the arrow XI.
Figure 12:
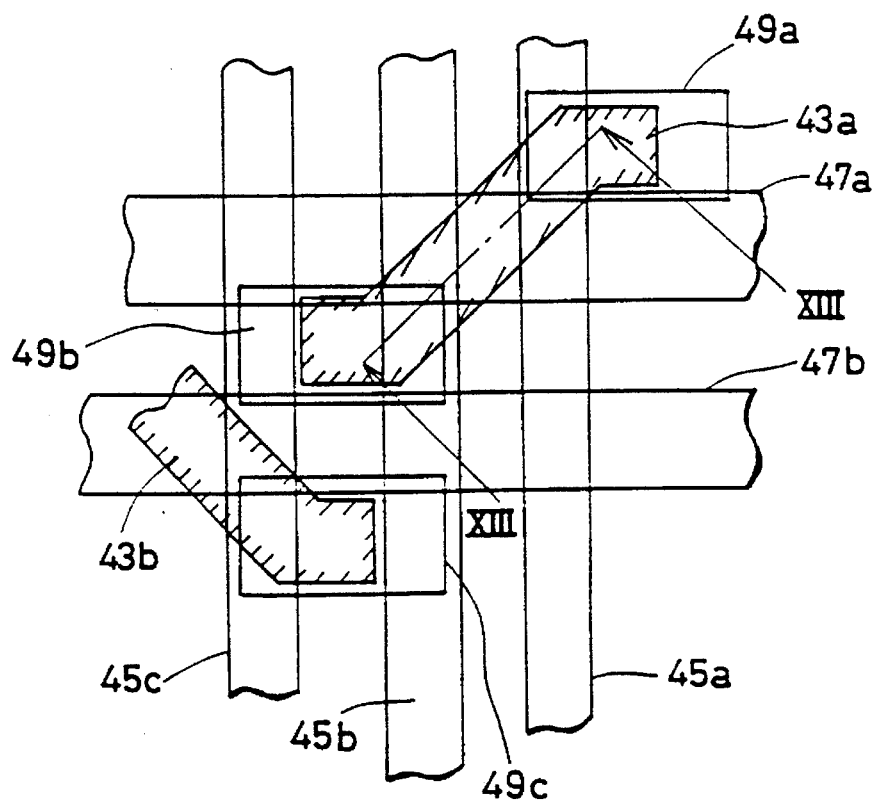
FIG. 12 is a partial plan view of one example of a conventional buried-bit line type memory cell.
Figure 13:
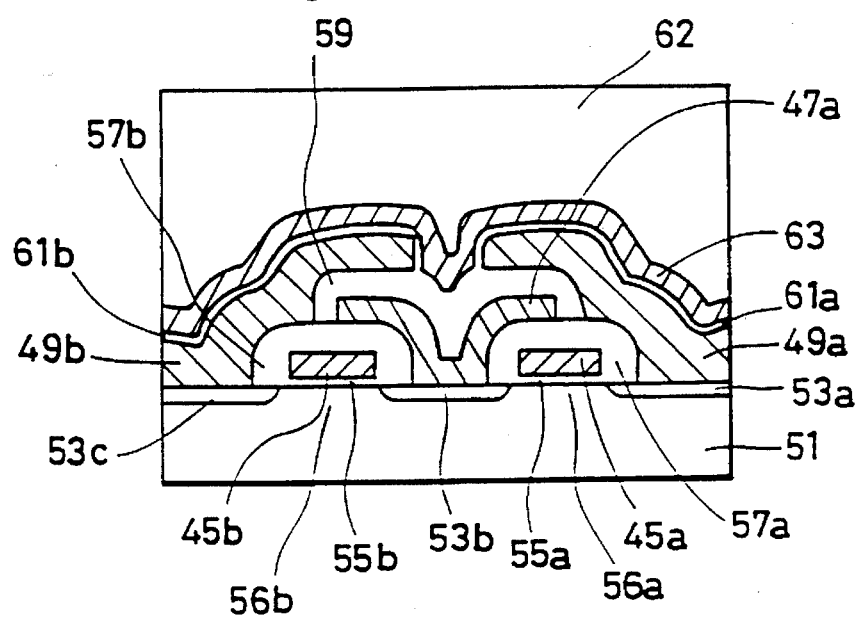
FIG. 13 is a cross sectional view of the memory cell shown in FIG. 12 taken along the direction of the arrow XIII.
Figure 14:
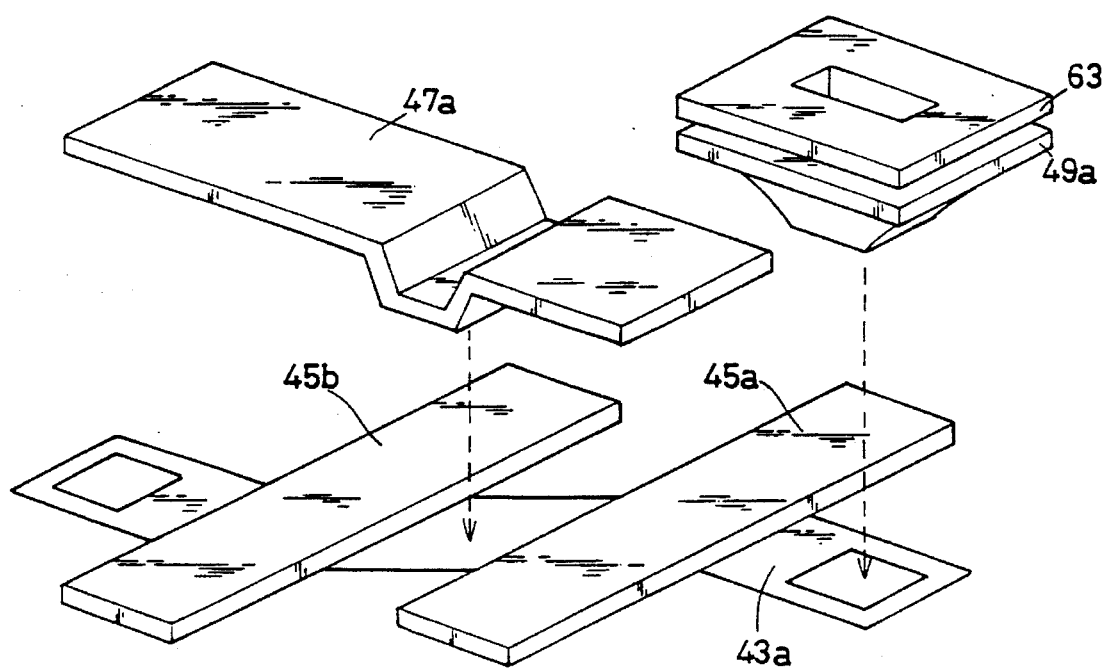
FIG. 14 is an exploded view of the memory cell shown in FIG. 12.

Referring to FIG. 3G, the polysilicon film 91 and silicon oxide film 115 are selectively etched away, leaving portion of the polysilicon film 91 and silicon oxide film 115 between the gate electrode portions 95a and 95b, with the resist 127 used as mask. For this etching, the reactive ion etching which is anisotropical etching is employed. The remaining polysilicon film is to be a bit line 91a. The conventional DRAM memory cell shown in FIG. 10 has the contact hole 27 for electrically connecting the impurity region 31b and the bit line 21a. Meanwhile, according to the memory cell manufacturing method of the embodiment of the DRAM in accordance with the present invention, the contact hole 96 is automatically formed when the sidewall insulator film 109 is formed.

Figure 3H:
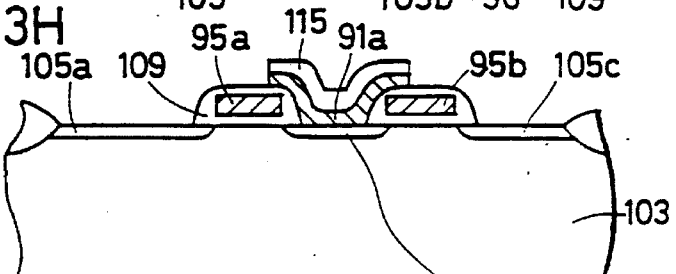

The resist 127 is removed, as shown in FIG. 3H.

Figure 3I:
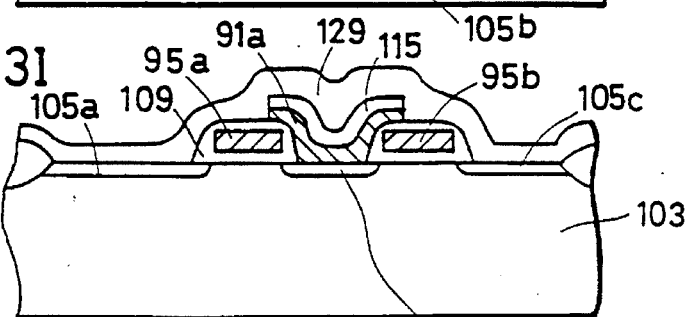

Referring to FIG. 3I, a silicon oxide film 129 is formed over the whole surface of the silicon substrate 103 by the CVD method.

Figure 3J:
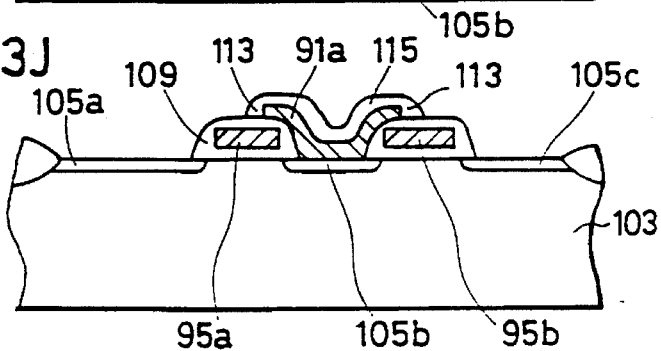

As shown in FIG. 3J, a sidewall insulator film 113 is then formed on the sides of the bit line 91a by subjecting the silicon oxide film 129 to the reactive ion etching. This reactive ion etching allows the impurity regions 105a and 105c to be exposed.

Figure 3K:
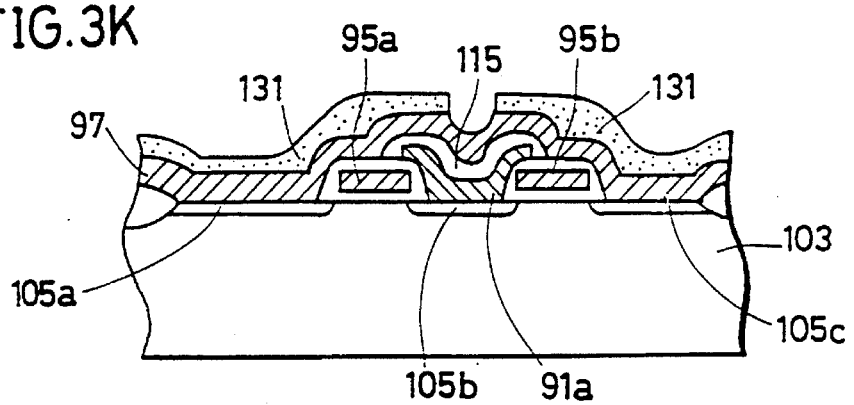
Figure 3L:
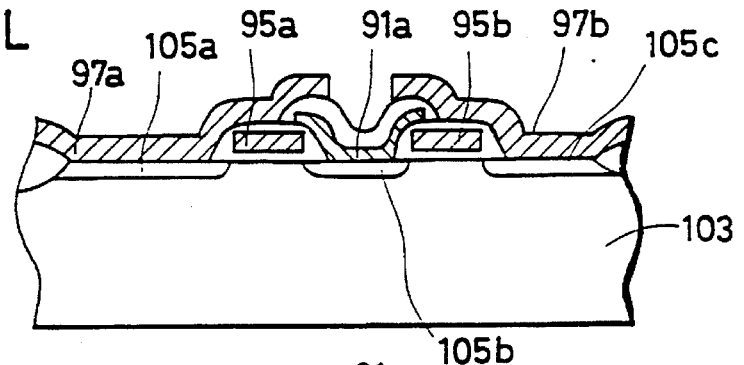

A polysilicon film 97 is then formed over the whole surface of the silicon substrate 103 by the CVD method as shown in FIG. 3K. A resist 131 is formed on the polysilicon film 97. The resist 131 is subjected to a predetermined patterning. With the resist 131 used as mask, the polysilicon film 97 is divided into polysilicon films 97a and 97b, as shown in FIG. 3L, by subjecting the polysilicon film 97 to the reactive ion etching. The polysilicon films 97a and 97b are to be storage nodes. The resist 131 is then removed.

Figure 3M:
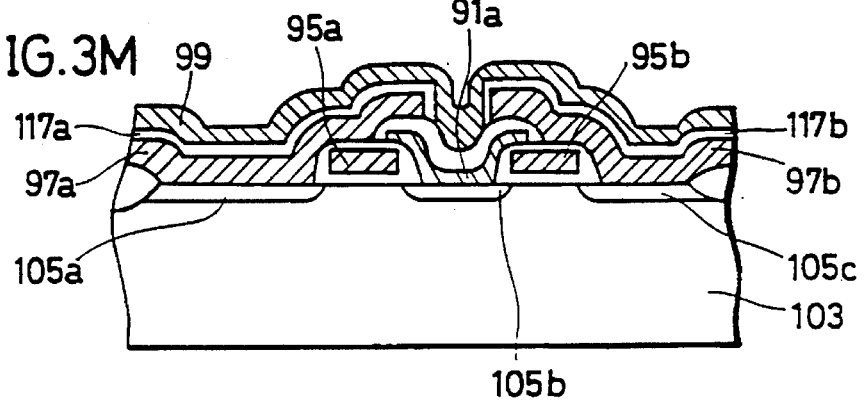
Figure 3N:
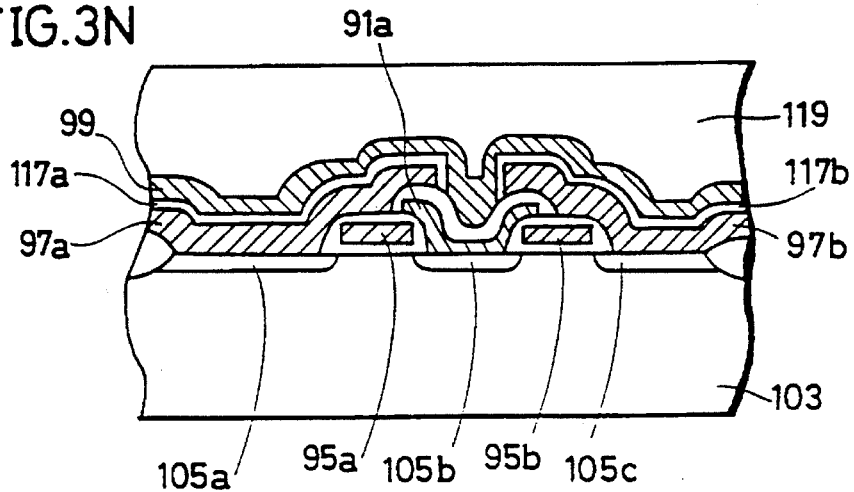

Referring to FIG. 3M, on the storage node 97a is formed a thin silicon oxide film 117a. On the storage node 97b is then formed a thin silicon oxide film 117b. The thin silicon oxide films 117a and 117b are formed by thermal oxidation. A polysilicon film 99 to be a cell plate is formed on the silicon oxide films 117a and 117b by the CVD method.

With reference to FIG. 3N, a BPSG (boro-phospho silicate glass) film 119 is formed on the cell plate 99 by the CVD method. All the memory cell manufacturing steps according to the embodiment of the DRAM of the present invention is here completed.

Effects of this embodiment will now be described. As shown in FIG. 2, the bit line 91a is covered with the silicon oxide film 115 and sidewall insulator film 113. The silicon oxide film 115 and sidewall insulator film 113 serve as dielectric films. The silicon oxide film 115 and sidewall insulator film 113 are covered with the storage nodes 97a and 97b and with the cell plate 99. When a voltage on the bit line 91a varies, charges are absorbed in a capacitor formed of the bit line 91a and storage node 97b, in a capacitor formed of the bit line 91a and storage node 97a and in a capacitor formed of the bit line 91a and cell plate 99. Thus, a voltage variation on the bit line 91a does not affect a voltage on the bit line 91b. Therefore, no voltage variation on the bit line 91a causes a variation in voltage on the bit line 91b, resulting in no malfunction of the memory device.

Figure 9:
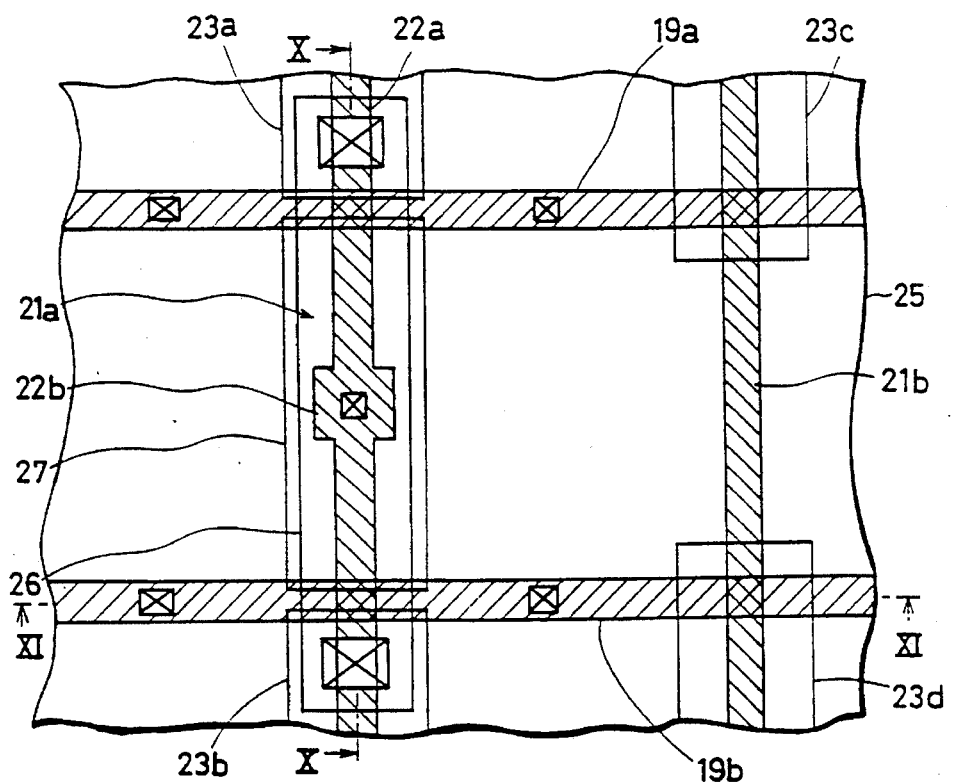
FIG. 9 is a plan view showing the memory cell portion of the conventional DRAM.

Further, as shown in FIG. 1, there is no position where the word lines 93a and 93b cross the active regions 101a and 101b. Therefore, when the word lines 93a and 93b make contact with the upper layer interconnection, such a disadvantage as described in the conventional example shown in FIG. 9 does not occur.

In this embodiment, the bit line is covered with the cell plate and portion of which is covered with the storage node. However, the present invention is not limitative to this, and hence at least one electrode layer out of the storage node and cell plate may be formed at an equal level to or at a higher level than the level of the bit line formed on the main surface of the silicon substrate. Alternatively, the bit line may be covered with only the storage node or only the cell plate.

Furthermore, in this embodiment, the gate electrode portions 95a, 95b and 95c and the bit lines 91a and 91b extend in parallel, as shown in FIG. 1. The present invention is, however, not limitative to this, and hence the gate electrode portions 95a, 95b and 95c may be positioned in another manner so as not to overlap the bit lines 91a and 91b.

Further, in this embodiment, as shown in FIG. 1, the active region 101a extends in parallel with the word lines 93a and 93b. The present invention is, however, not limitative to this, and hence the active region 101a may be positioned in another manner as far as it is placed between the word lines 93a and 93b.

Figure 4:
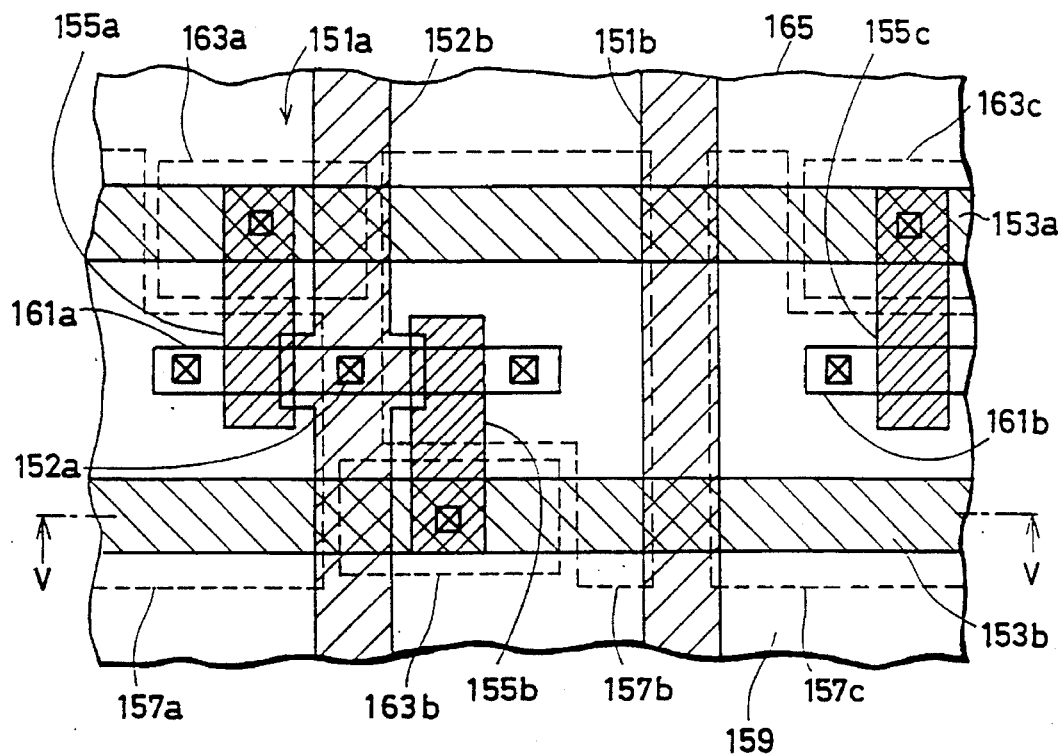
FIG. 4 is a plan view showing a memory cell portion according to another embodiment of the semiconductor memory device of the present invention.

Another embodiment of the DRAM according to the present invention will now be described. FIG. 4 is a plan view showing a memory cell portion of another embodiment of the DRAM according to the present invention. As shown in FIG. 4, active regions 161a and 161b are formed in a main surface of a silicon substrate 165. Bit lines 151a and 151b extend in parallel spaced from each other on the main surface of the silicon substrate 165. The bit line 151a comprises a contact portion 152a and an extended portion 152b. The bit line 151b also comprises a contact portion and an extended portion, but only the extended portion is represented in FIG. 4. The bit lines 151a and 151b are made of polysilicon. The active region 161a and the bit line 151a are intersecting. The active region 161a is electrically connected to the contact portion 152a of the bit line 151a.

A gate electrode portion 155a is positioned on a portion of the active region 161a, which is between one end of the active region 161a and the bit line 151a. A gate electrode portion 155b is positioned on a portion of the active region 161a, which is between the other end of the active region 161a and the bit line 151a. A gate electrode portion 155c is positioned on the active region 161b. The gate electrode portions 155a, 155b and 155c are made of polysilicon.

On the main surface of the silicon substrate 165 are formed storage nodes 157a, 157b and 157c made of polysilicon. One end of the active region 161a is electrically connected to the storage node 157a. The other end of the active region 161a is electrically connected to the storage node 157b. One end of the active region 161b is electrically connected to the storage node 157c. A cell plate 159 made of polysilicon is formed on the storage nodes 157a–157c. Contact holes 163a, 163b and 163c are formed on the gate electrode portions 155a, 155b and 155c, respectively. Neither storage nodes 157a–157c nor cell plate 159 are formed in the contact holes 163a–163c.

Word lines 153a and 153b extend in parallel spaced from each other on the cell plate 159. The bit lines 151a and 151b extend perpendicularly to the extension of the word lines 153a and 153b. The word line 153a is made of aluminum. The word line 153a and the gate electrode portion 155a are electrically connected by aluminum interconnected along a wall surface of the contact hole 163a. The word line 153a and gate electrode portion 155c are electrically connected by aluminum interconnected along a wall surface of the contact hole 163c. The word line 153b is also made of aluminum. The word line 153b and gate electrode portion 155b are electrically connected by aluminum interconnected along a wall surface of the contact hole 163b.

Figure 5:
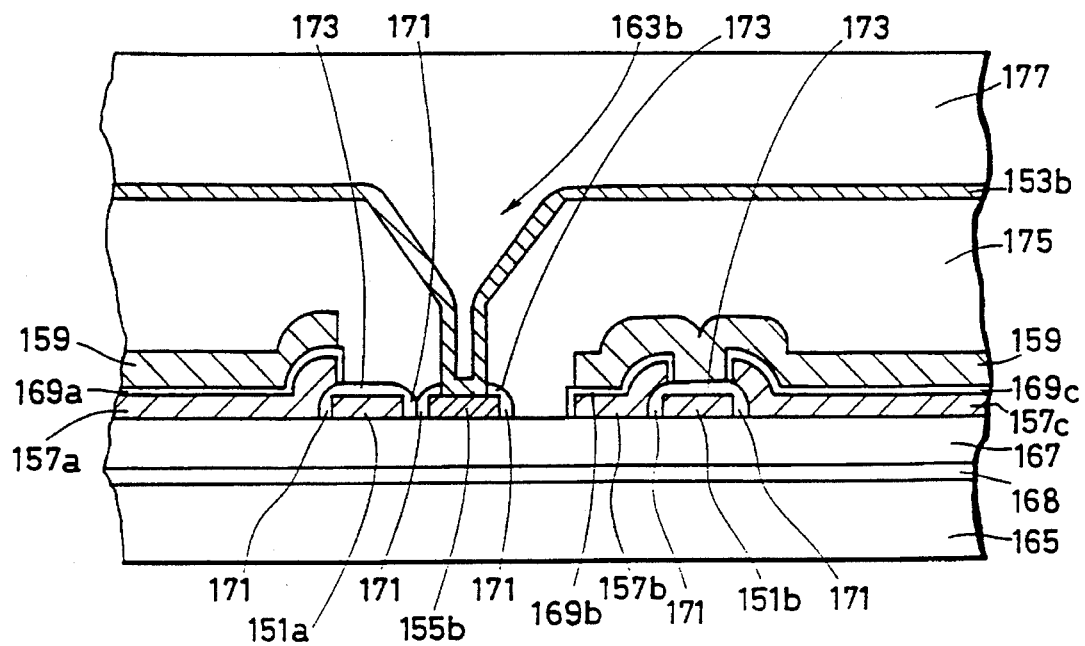
FIG. 5 is a cross sectional view of the memory cell shown in FIG. 4 taken along the direction of the arrow V.

FIG. 5 is a cross sectional view of the memory cell shown in FIG. 4 taken along the direction of the arrow V. As shown in FIG. 5, a field oxide film 167 is formed on the main surface of the silicon substrate 165. A P type channel stopper 168 is formed beneath the field oxide film 167. On the field oxide film 167 are formed the bit line 151a, the gate electrode portion 155b and the bit line 151b spaced from one another. A silicon oxide film 173 is formed on the bit line 151a, on the gate electrode portion 155b and on the bit line 151b. A sidewall insulator film 171 is formed on side portions of the bit line 151a, gate electrode portion 155b and bit line 151b. On the field oxide film 167 are formed the storage nodes 157a–157c. The bit line 151a is formed between the storage node 157a and the gate electrode portion 155b. The storage node 157b is formed between the gate electrode portion 155b and the bit line 151b. The bit line 151b is formed between the storage nodes 157b and 157c. Thin silicon oxide films 169a, 169b and 169c are formed on the storage nodes 157a–157c, respectively. The silicon oxide films 169a–169c are to be dielectrics. The cell plate 159 is formed on the silicon oxide films 169a–169c.

A BPSG film 175 is formed over the silicon oxide film 173 on the bit line 151a and gate electrode portion 155b and over the cell plate 159. The contact hole 163b is formed in the silicon oxide film 173 on the gate electrode portion 155b and in the BPSG film 175. The word line 153b is formed on the BPSG film 175. The word line 153b and gate electrode portion 155b are electrically connected by aluminum interconnected along the wall surface of the contact hole 163b. On the word line 153b is formed a BPSG film 177.

A method of manufacturing the portion shown in FIG. 5 will now be described with reference to FIGS. 6A–6I.

Figure 6A:
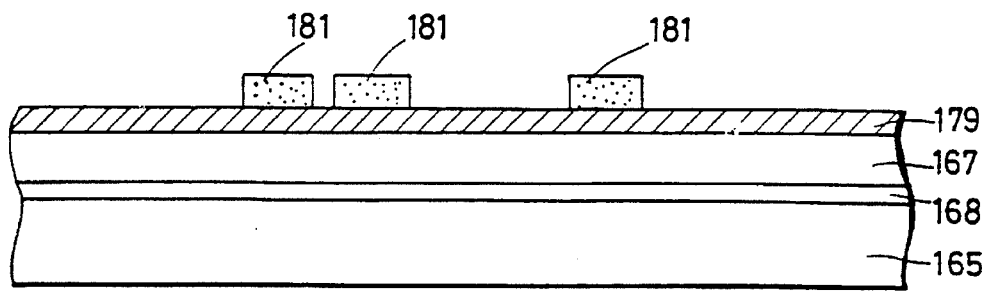

As shown in FIG. 6A, boron is implanted into the silicon substrate 165 so as to form the channel stopper 168. The field oxide film 167 is then formed on the main surface of the silicon substrate 165. A polysilicon film 179 is formed on the field oxide film 167 by the CVD method. A resist 181 is formed on the polysilicon film 179 to be subjected to a predetermined patterning. The polysilicon film 179 is selectively etched with the resist 181 used as mask. The resist 181 is removed after etching.

Figure 6B:
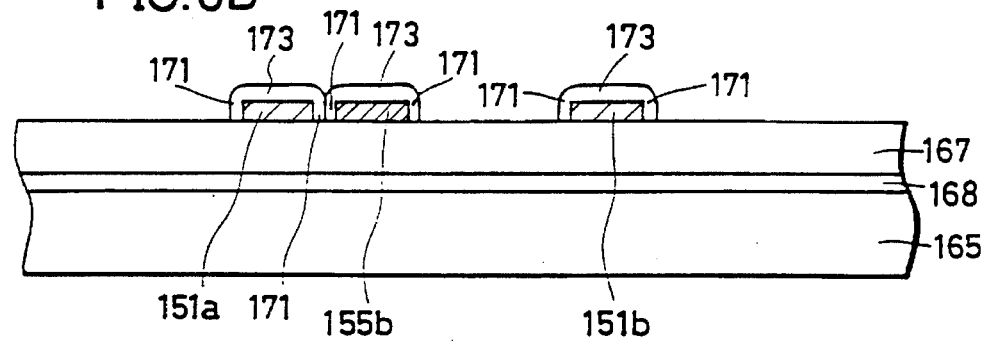

Referring to FIG. 6B, the polysilicon film left on the field oxide film 167 is to be the bit line 151a, the gate electrode portion 155b and the bit line 151b. The silicon oxide film 173 is then formed on the bit lines 151a and 151b and on the gate electrode portion 155b. The sidewall insulator film 171 is formed on side portions of the bit lines 151a and 151b and gate electrode portion 155b. A method of forming the silicon oxide film 173 and the sidewall insulator film 171 is the same as that in the case of the embodiment of the present invention shown in FIG. 3E.

Figure 6C:
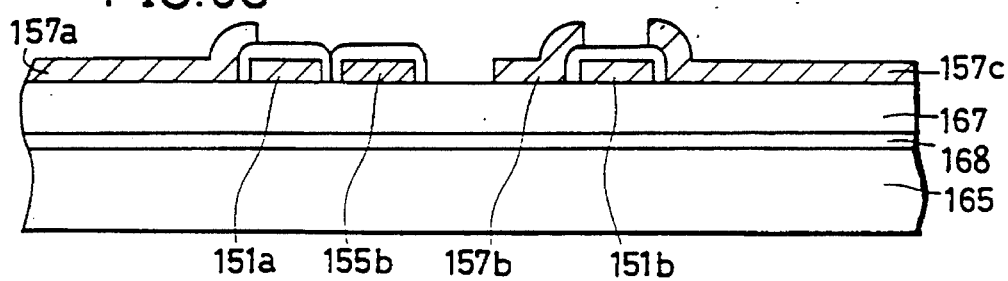

As shown in FIG. 6C, a polysilicon film is formed on the field oxide film 167 by the CVD method. A resist is formed on the polysilicon film to be subjected to a predetermined patterning. With the resist used as mask, the polysilicon film is selectively etched so as to form the storage nodes 157a –157c. The remaining resist is removed after etching.

Figure 6D:
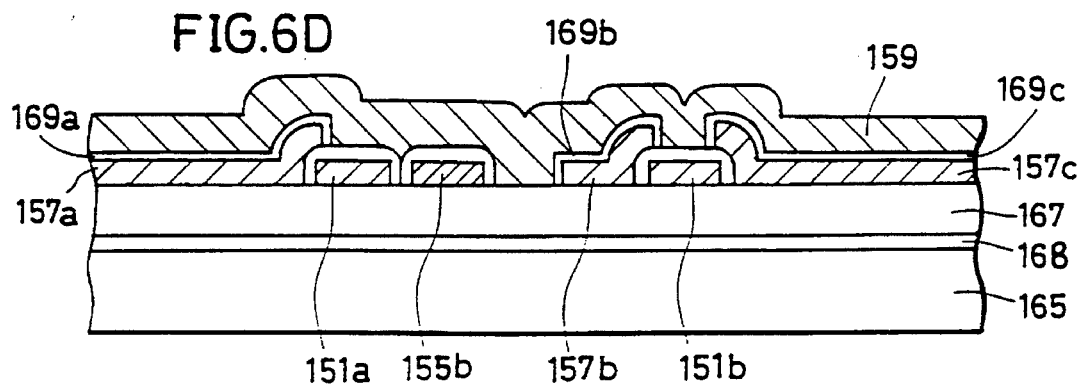

Referring to FIG. 6D, the thin silicon oxide films 169a–169c are formed on the storage nodes 157a –157c by thermal oxidation, respectively. A polysilicon film 159 is then formed on the thin silicon oxide films 169a–169c by the CVD method. The polysilicon film 159 is to be a cell plate.

As shown in FIG. 6E, a resist 183 is formed on the cell plate 159 to be subjected to a predetermined patterning.

Referring to FIG. 6F, the cell plate 159 is selectively etched with the resist 183 used as mask. The type of this etching is the reactive ion etching. The resist 183 is then removed after etching.

The BPSG film 75 is then formed on the cell plate 159 by the CVD method, as shown in FIG. 6G.

Figure 6H:
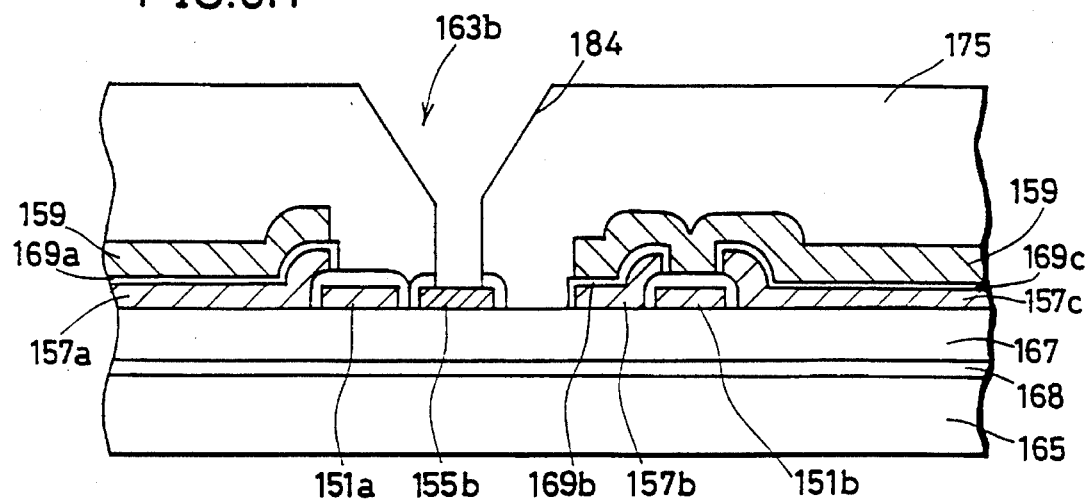

With reference to FIG. 6H, the contact hole 163b is formed in the silicon oxide film 173 on the gate electrode portion 155b and in the BPSG film 175. The formation of the contact hole 163b employs a plasma etching which is isotropical etching in the middle course of the formation, but employs a reactive ion etching which is anisotropical etching thereafter to the end. A taper 184 is formed at a portion etched by plasma etching. The taper 184 causes the word line interconnected in the contact hole 163b to have a good step coverage.

Figure 6I:
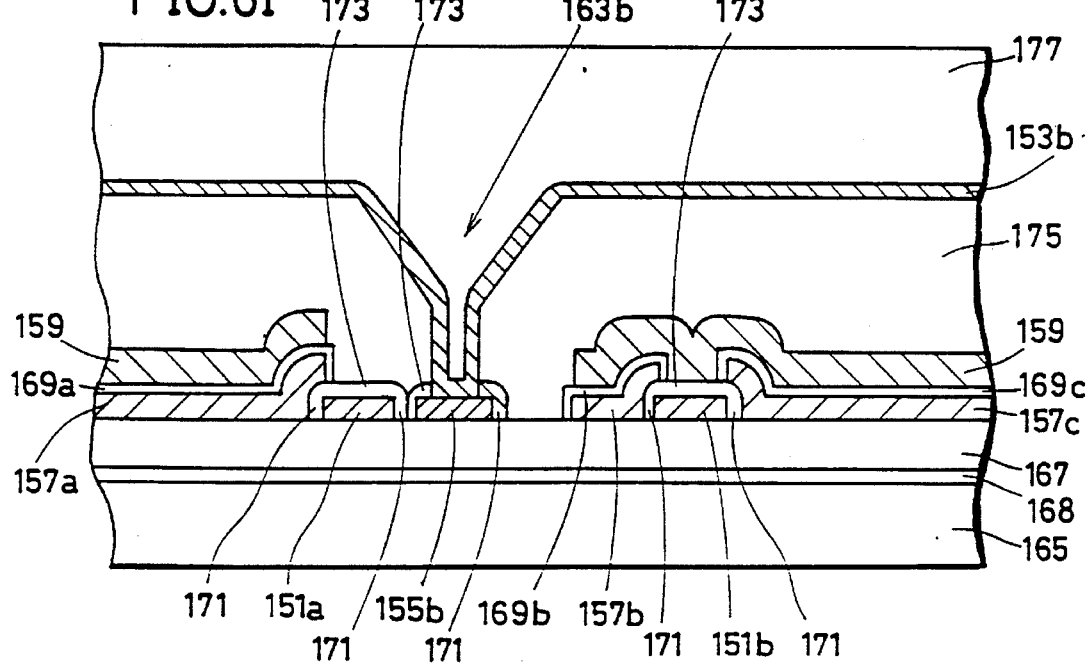
Figure 7:
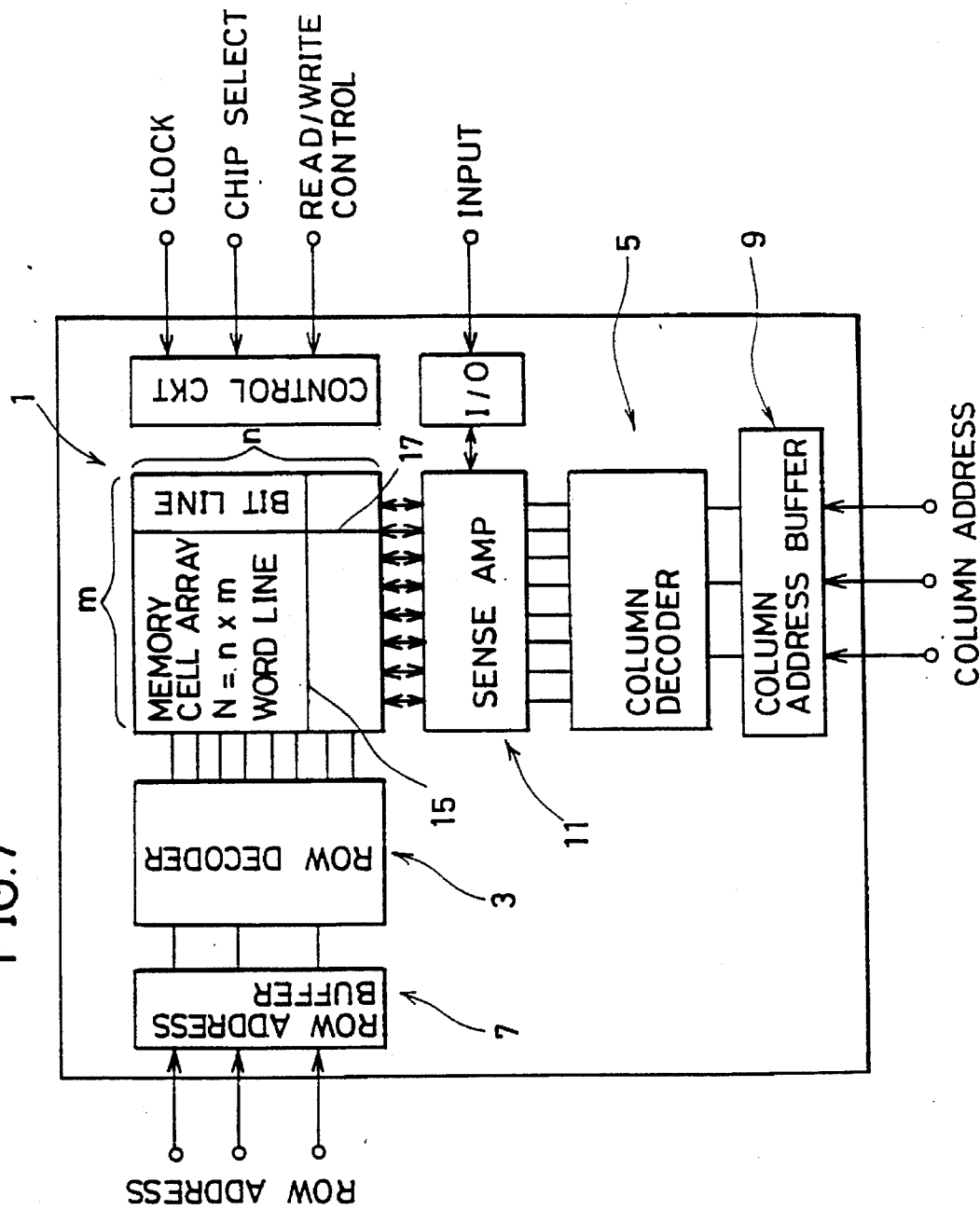
FIG. 7 is a block diagram of a conventional DRAM.
Figure 8A:
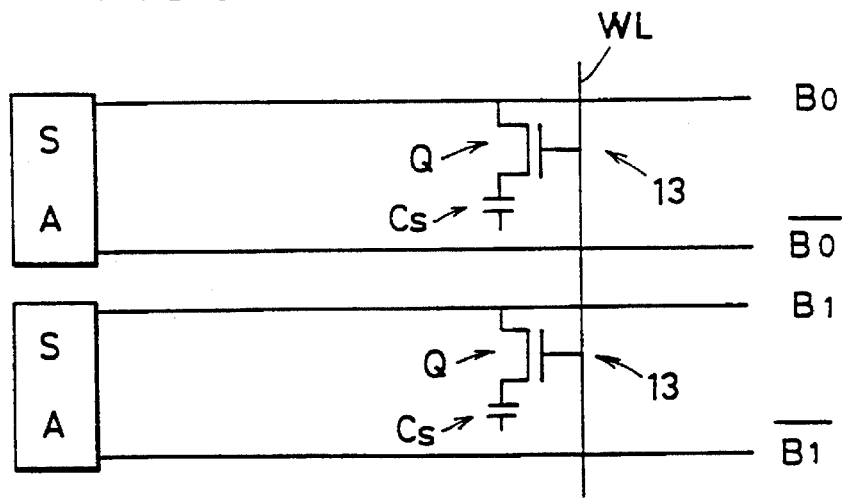
FIG. 8A is an equivalent circuit diagram of a memory cell.
Figure 8B:
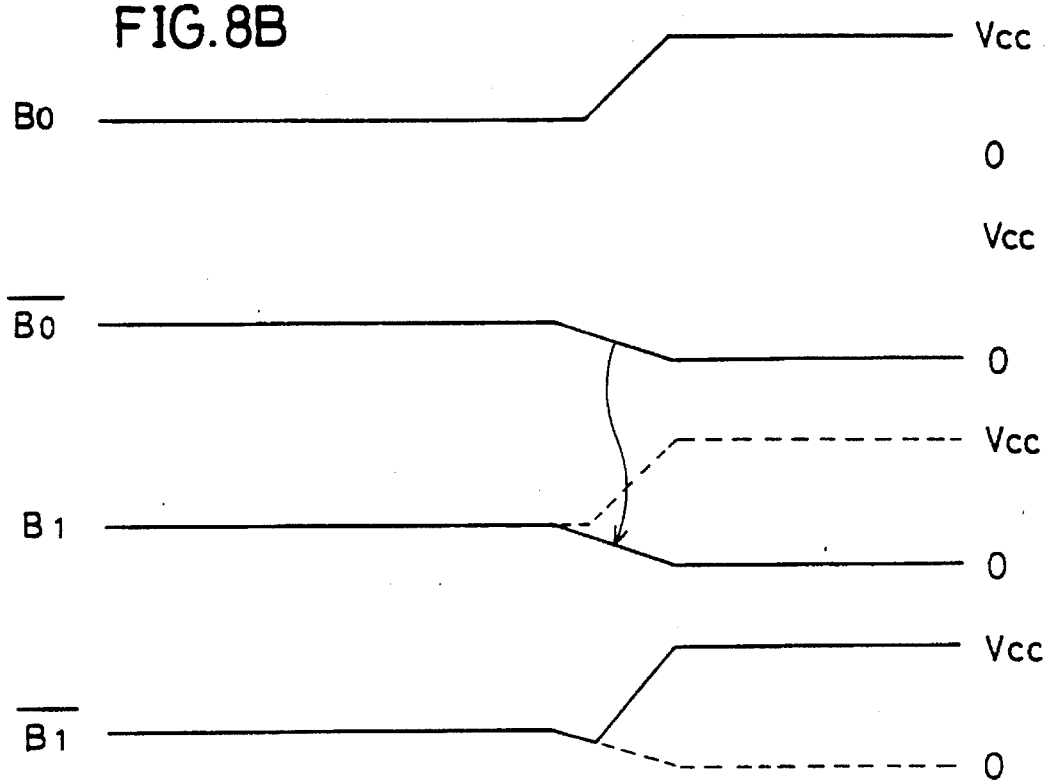
FIG. 8B is a waveform diagram showing voltages on bit lines B0, $\overline{B0}$, B1, $\overline{B1}$ shown in FIG. 8A.

Referring to FIG. 6I, an aluminum interconnection layer 153b is formed on the BPSG film 175 by sputtering. The aluminum interconnection layer 153b is to be a word line. The word line 153b and gate electrode portion 155b are electrically connected by aluminum interconnected along the wall surface of the contact hole 163b. The BPSG film 177 is then formed on the word line 153b by the CVD method. All the steps of manufacturing the portion shown in FIG. 5 are here completed.

As shown in FIG. 4, the second embodiment of the DRAM according to the present invention employs the word lines 153a and 153b made of aluminum, and the gate electrode portions 155a –155c made of polysilicon. Since aluminum has a lower resistance value than polysilicon, it makes it possible to achieve a decrease in power consumption, according to this embodiment of the DRAM of the present invention. Further, since polycide has a lower resistance value than polysilicon, the structure of the gate electrode portions 155a –155c made of polycide enables a further decrease in power consumption.

According to this embodiment, as shown in FIG. 4, the word lines 153a and 153b are made of aluminum and the gate electrode portions 155a –155c are made of polysilicon. The present invention is, however, not limitative to this, and hence any other materials may be employed for the word lines 153a and 153b and gate electrode portions 155a –155c as far as the material of the word lines 153a and 153b has a lower resistance value than that of the material of the gate electrode portions 155a –155c.

In this embodiment, employment of aluminum for the material of the word lines 153a and 153b achieves a decrease in resistance of the word lines 153a and 153b. Moreover, employment of polysilicon for the material of the gate electrode portions 155a –155c increases a heat resistivity of the gate electrode portions 155a –155c. The present invention is, however, not limitative to this, and hence, for achieving another effect, a material which can achieve that effect may be employed for the material of the word lines 153a and 153b and for that of the gate electrode portions 155a –155c.

According to this embodiment, as shown in FIG. 5, the electrical connection between the word line 153b and the gate electrode portion 155b is attained by the aluminum interconnected along the wall surface of the contact hole 163b. The present invention is, however, not limitative to this, and hence tungsten or molybdenum may be employed, which is filled in the contact hole 163b by a selective CVD method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a semiconductor substrate having a main surface;

a word line formed on said main surface;

a field effect transistor including a first impurity region formed in said main surface, a second impurity region formed in said main surface and spaced apart from said first impurity region to define a channel region therebetween, and a gate electrode portion, said gate electrode portion branching laterally from said word line to overlap said channel region, the entire side surface of said gate electrode portion being defined by a straight line perpendicular to said word line;

a bit line formed on said main surface to be electrically connected to said first impurity region, said bit line crossing said word line at a different level above the substrate; and a capacitor including a first electrode layer electrically connected to said second impurity region, and a second electrode layer facing said first electrode layer with a first dielectric therebetween, at least one of said first and second electrode layers being formed at an equal level to or at a higher level than the level of said bit line formed on said main surface.

2. A semiconductor memory device comprising:

a semiconductor substrate having a main surface;

a word line formed on said main surface;

a field effect transistor including a first impurity region formed in said main surface, a second impurity region formed in said main surface and spaced apart from said first impurity region to define a channel region therebetween, and a gate electrode portion, said gate electrode portion branching laterally from said word line to overlap said channel region, a material of said word line having a lower resistance value than a material of said gate electrode portion;

a bit line formed on said main surface to be electrically connected to said first impurity region, said bit line crossing said word line at a different level above the substrate, and a capacitor including a first electrode layer electrically connected to said second impurity region, and a second electrode layer facing said first electrode layer with a first dielectric therebetween.

3. The semiconductor memory device in accordance with claim 1, wherein said gate electrode portion and said bit line extend in parallel.

4. The semiconductor memory device in accordance with claim 1, wherein said second electrode layer overlaps said bit line.

5. The semiconductor memory device in accordance with claim 1, wherein said first electrode layer overlaps said bit line.

6. The semiconductor memory device in accordance with claim 4, wherein said first electrode layer overlaps a portion of said bit line, and a second dielectric is provided between said first electrode layer and said bit line.

7. The semiconductor memory device in accordance with claim 6, wherein said second dielectric comprises a silicon oxide film.

8. The semiconductor memory device in accordance with claim 2, wherein said gate electrode portion and said bit line extend in parallel.

9. A semiconductor memory device, comprising:

a semiconductor substrate having a main surface;

a word line formed on said main surface;

a field effect transistor including a first impurity region formed in said main surface, a second impurity region formed in said main surface, spaced apart from said first impurity region to form a channel region, said first and second impurity regions and said channel region defining an active area, and a gate electrode portion, said electrode portion formed on said main surface and extending laterally from said word line to overlap said channel region;

a bit line formed on said main surface to be electrically connected to said first impurity region, said bit line crossing said word line at a different level above the substrate; and a capacitor including a first electrode layer electrically connected to said second impurity region, and a second electrode layer facing said first electrode layer with a first dielectric therebetween, at least one of said first and second electrode layers being formed at a level equal to or higher than the level of said bit line formed on said substrate, wherein said word line extends parallel to said active area.

10. The semiconductor memory device in accordance with claim 2, wherein an interconnection layer is formed above said word line, and said word line and said interconnection layer are electrically connected with each other.

11. The semiconductor memory device in accordance with claim 2, wherein said second electrode layer overlaps said bit line.

12. The semiconductor memory device in accordance with claim 2, wherein said first electrode layer overlaps said bit line.

13. The semiconductor memory device in accordance with claim 11, wherein said first electrode layer overlaps a portion of said bit line, and a second dielectric is provided between said first electrode layer and said bit line.

14. The semiconductor memory device in accordance with claim 13, wherein said second dielectric comprises a silicon oxide film.

* * * * *